(12) United States Patent
Mertens et al.

(10) Patent No.: US 9,929,734 B2
(45) Date of Patent: Mar. 27, 2018

(54) METHOD FOR CHANGING THE CONFIGURATION OF A PROGRAMMABLE LOGIC MODULE

(71) Applicant: dSPACE digital signal processing and control engineering GmbH, Paderborn (DE)

(72) Inventors: Frank Mertens, Bad Lippspringe (DE); Marc Dressler, Horn-Bad Meinberg (DE)

(73) Assignee: DSPACE DIGITAL SIGNAL PROCESSING AND CONTROL ENGINEERING GMBH, Paderborn (DE)

( * ) Notice: Subject to any disclaimer, the term of this patent is extended or adjusted under 35 U.S.C. 154(b) by 8 days.

(21) Appl. No.: 15/258,059

(22) Filed: Sep. 7, 2016

(65) Prior Publication Data

US 2017/0070229 A1 Mar. 9, 2017

(30) Foreign Application Priority Data

Sep. 8, 2015 (DE) ........................ 10 2015 115 022
Sep. 8, 2015 (EP) ...................................... 15184169

(51) Int. Cl.
*H03K 19/177* (2006.01)

(52) U.S. Cl.
CPC ... *H03K 19/17756* (2013.01); *H03K 19/1776* (2013.01)

(58) Field of Classification Search
CPC ..................... H03K 19/17756; H03K 19/1776
(Continued)

(56) References Cited

U.S. PATENT DOCUMENTS 7,541,833 B1* 6/2009 Neuendorffer et al.
........................ H03K 19/17756
326/38
7,902,866 B1 3/2011 Patterson et al.
(Continued)

FOREIGN PATENT DOCUMENTS

EP 2869145 A1 5/2015

OTHER PUBLICATIONS

EPO, Extended European search report, including European search report and European search opinion dated Mar. 17, 2016 for application No. 15 184 169.9.
(Continued)

*Primary Examiner* — Sun Lin
(74) *Attorney, Agent, or Firm* — Orrick, Herrington & Sutcliffe LLP; Joseph A. Calvaruso; Richard F. Martinelli (57) ABSTRACT

In a method for changing a configuration of a programmable logic module, an initial configuration of the programmable logic module is read in, with a result that a logic description, in particular a mapped netlist, of the initial configuration is at least partially available. One or more logic elements and/or connection elements from the logic description of the initial configuration of the programmable logic module are replaced or reconfigured and a logic description of a target configuration having one or more additional logic elements are created, none or a plurality of elements of the initial configuration being missing in the target configuration. Assignment information is used to determine transfer points, that is to say logic elements present in the target configuration and the initial configuration, in particular registers, and/or connection elements, to which a changed logic function is applied in the target configuration, at least the logic elements of the programmable logic module which are already unused in the initial configuration being marked as free, and the additional logic elements of the target configuration being placed on the logic elements marked as free and
(Continued)

being connected to the transfer points via unused connection elements. A changed bit stream is created from the logic description of the target configuration, and the changed bit stream is written to the programmable logic module.

22 Claims, 4 Drawing Sheets

(58) Field of Classification Search
USPC .......................................... 716/110, 116, 117
See application file for complete search history.

(56) References Cited

U.S. PATENT DOCUMENTS

| 7,906,984 | B1* | 3/2011 | Montminy et al. |
| | | | ........................ H03K 19/17732 |
| | | | 326/10 |
| 7,940,082 | B1 | 5/2011 | Wright |
| 8,786,310 | B1 | 7/2014 | Lu et al. |

OTHER PUBLICATIONS

DE, German search report dated Aug. 11, 2016 for application No. 102015115022.0.

Soni, R.K.; Steiner, N.; French, M. Open source bitstream generation. In 2013 IEEE 21st Annual International Symposium on Field-Programmable Custom Computing Machines (FCCM), pp. 105-112, 2013.

Hutchings, B.L.; Keeley, J. Rapid Post-Map Insertion of Embedded Logic Analyzers for Xilinx FPGAs. In 2014 IEEE 22nd Annual International Symposium on Field-Programmable Custom Computing Machines (FCCM), pp. 72-79, 2014.

Le Roux, R.R. Bitstream specialisation for dynamic reconfiguration of real-time applications. Thesis submitted for the degree Philosophiae Doctor in Computer and Electronics at the Potchefstroom Campus of the North-West University, 2014.

Zha, W. Facilitating FPGA reconfiguration through low-level manipulation. Dissertation submitted to the Faculty of the Virginia Polytechnic Institute and State University, 2014.

* cited by examiner

METHOD FOR CHANGING THE CONFIGURATION OF A PROGRAMMABLE LOGIC MODULE

CROSS REFERENCE TO RELATED APPLICATIONS

This application claims the benefit of German patent application no. DE102015115022.0, filed on Sep. 8, 2015; and European patent application no. EP15184169.9, filed on Sep. 8, 2015. The entire contents of each application is hereby incorporated by reference in its entirety.

BACKGROUND OF THE INVENTION

The invention generally relates to a method for changing the configuration of a programmable logic module, a method for adapting a control device comprising a programmable logic module set up to execute a regulating function, and to a programming apparatus for writing to a programmable logic module.

In many fields of technology, control devices are used to regulate a physical process, a microcontroller of the control device cyclically executing a program which comprises determining new measured values from one or more sensors and actuating one or more actuators on the basis of a comparison of the measured values with desired values. In order to speed up the design of new control devices or regulating algorithms, placement on an existing control device is often carried out in this case and only individual (sub)functions are replaced. This procedure which is also known under the term bypassing can either be completely implemented on the existing control device (internal bypassing) or can resort to a separate Rapid Control Prototyping system (abbreviated to RCP system) in order to call the new function(s), the so-called bypass functions (external bypassing). Individual functions can be expediently replaced by adapting jump instructions.

EP 2869145 A1 discloses a method for influencing a control program of a control device, the control program comprising a multiplicity of first functions, at least one of which is designed to control an actuator, and a memory being provided, said memory having memory areas occupied by subroutines assigned to the first functions. The control program is in the form of a binary program code, the program code of the control program containing a jump address when called by one of the first functions, which jump address points to a memory address of the subroutine associated with the function call, and the subroutine being in the form of a sequence of binary program code, and a return instruction being present at the end of the sequence of the program code of the subroutine. The program code of the control program is examined for the occurrence of function calls and the jump addresses associated with the function calls and addresses of the return instructions are determined, the memory areas of the memory which are occupied by the respective subroutines being determined from the determination of the size. The designators which are assigned to the first functions and have sizes associated with the respective first functions and addresses of the memory areas are displayed in a display unit which is designed as part of a computer system. The computer system is used to select at least one of the first functions to be deleted, the size and address of the selected first function being stored in a function structure and at least one function call of the selected first function being deactivated and/or the first function being replaced with a second function by overwriting the program code of the selected first function with the program code of the second function.

Programmable logic modules known under the term Field Programmable Gate Array (abbreviated to FPGA) are increasingly being used to simulate and regulate systems with a high dynamic response, which logic modules also reliably regulate rapidly variable sections by use of parallel processing and a logic circuit that is tailored to the respective application. Since no sequential execution is carried out, unlike in microprocessors, and since no jump instructions are present, no bypassing has hitherto been able to be carried out for the regulating functions implemented on an FPGA. Another disadvantage of using FPGAs is that minor adaptations to the individual logic functions are possible only to a limited extent since the circuit has to be completely resynthesized in each case, which is time-consuming, in particular on account of the optimization of placement and routing. It would therefore be desirable to provide a simple way of adapting logic functions for programmable logic modules as well.

Partial reconfiguration is a procedure which is known from U.S. Pat. No. 7,902,866 B2, for example, for being able to change the configuration of an FPGA subsequently or at the runtime. In preparation for this, the FPGA configuration must already be divided into partitions in the design phase, in which case a first and a second partition, for example, are therefore created. Logic functions which are unalterable or are always present are provided in the first partition. The second partition is then a delimited area for which partial resynthesis and partial reconfiguration are possible, with the result that, in principle, the logic functions arranged in the second partition can be changed.

However, this procedure has a number of disadvantages. The partition interfaces must already be planned and firmly implemented in the initial design. Irrespective of the functionality or logic function implemented in the second partition, a fixed number of logic units and connection elements is reserved. As a result of the therefore necessary reservation of the greatest assumed number of required logic elements, resources remain unused in many cases. All logic functions arranged in the first partition remain firm; even when the currently implemented functionality of the second partition does not need them, there is still a space and energy requirement of the functions.

In order to design and process an FPGA configuration, "Torc: Towards an Open Source Tool Flow", Proceedings of the 19th Annual ACM/SIGDA International Symposium on Field Programmable Gate Arrays, 2011, by N. Steiner et al. was presented. The Steiner reference discloses reading and writing a logic description in the form of an unmapped or mapped netlist. In light of Steiner, R. K. Soni et al. describe in "Open-Source Bitstream Generation", 21st IEEE Annual International Symposium on Field-Programmable Custom Computing Machines 2013, a possible way of making quick modifications to a bit stream which describes an FPGA configuration. A library of micro bit streams each describing individual basic units can be used to add further logic elements to an existing configuration on the basis of a mapped netlist.

"RapidSmith: Do-it-Yourself CAD Tools for Xilinx FPGAs", 2011 21st International Conference on Field Programmable Logic and Applications, by C. Lavin et al. discloses a further design tool for FPGA configurations. In light of the Lavin reference, the paper "Rapid Post-Map Insertion of Embedded Logic Analyzers for Xilinx FPGAs", 22nd IEEE Annual International Symposium on Field-Programmable Custom Computing Machines 2014, by B. L.

Hutchings and J. Keeley describes a possible way of modifying an existing FPGA configuration without the need to recompile or resynthesize the complete circuit. Measuring circuits can therefore be subsequently introduced into an FPGA configuration which is otherwise unchanged by using previously unused logic elements or areas of the FPGA. Individual logic functions are not adapted and the values or signals which are output are therefore not changed.

BRIEF SUMMARY OF THE INVENTION

Against this background, an object of the invention is to specify a method and an apparatus which advances the state of the art and preferably enables a functionality which is comparable to the known bypassing methods when developing control devices comprising programmable logic modules.

Disclosed is a method for changing the configuration of a programmable logic module, in which an initial configuration of the programmable logic module is read in, with the result that a logic description, in particular a mapped netlist, of the initial configuration is at least partially available, one or more logic elements and/or connection elements from the logic description of the initial configuration of the programmable logic module being replaced or reconfigured and a logic description of a target configuration having none, one or more additional logic elements being created, none, one or more elements of the initial configuration not being used in the target configuration. Assignment information is used to determine transfer points, that is to say logic elements present in the target and initial configurations or their inputs or outputs, in particular registers or drivers, to which a changed logic function is applied in the target configuration, at least the logic elements of the programmable logic module which are already unused in the initial configuration being marked as free, and the additional logic elements of the target configuration being placed on the logic elements marked as free and being connected to the transfer points via unused connection elements. A changed bit stream is created from the logic description of the target configuration, and the changed bit stream is written to the programmable logic module.

Programmable logic modules comprise, in particular, modules which are known under the abbreviations FPGA, CPLD and PLD and have a multiplicity of logic elements and a multiplicity of connection elements, the precise configuration of which is determined after the module has been restarted on the basis of a bit stream which has been read in. For this purpose, programmable logic modules expediently have a configuration memory which comprises at least one bit for each logic element and each switchable connection element and is preferably constructed from static memory cells (SRAM, in particular in the case of FPGAs) or non-volatile memories (FLASH, in particular in the case of PLDs).

In this case, a logic element can be understood as meaning elementary units of the programmable logic module such as registers, truth tables and delay units. Logic elements preferably also comprise drivers, in particular for an interface pin of an FPGA, as well as permanently predefined dedicated logic circuits, for example for a multiplication of a plurality of values. Reconfiguration of a logic element is expediently used to mean changing of at least one property of the logic element. For example, reconfiguration of a truth table would mean that at least one output value of the table has changed in comparison with the initial configuration; in the case of a dedicated logic circuit, reconfiguration could also involve, for example, applying a clock pulse or activating or deactivating the dedicated logic circuit.

One or more logic elements and/or connection elements of the initial configuration are preferably replaced or reconfigured using assignment information which may have been provided, in particular, by the producer of the initial configuration. If a complete logic description of the initial configuration is not available, the assignment information expediently comprises at least available input signals and possible output points. The assignment information may comprise a list of transfer points which is directly specified by the producer of the initial configuration; alternatively or additionally, the user can predefine one or more transfer points. A changed logic function is applied to a transfer point, in particular, when the signal path of an input of the transfer point contains at least one additional or reconfigured logic element. Logic functions expediently comprise a number of successive logic elements, an output of a first logic element being at least partially connected to an input of a second logic element, with the result that a continuous signal path exists from an input of the logic function to an output. Logic functions are preferably considered starting from an interface pin of the programmable logic module which is configured to receive signals.

Additional logic elements of the target configuration are used to mean those logic elements which are arranged in a signal path in the target configuration but were not connected either directly or indirectly, that is to say via further logic elements, to an output or an interface pin of the programmable logic module in the initial configuration. In order to be able to continue to operate the target configuration at high FPGA clock rates, free logic elements in the vicinity (for example within a defined radius) of the respective transfer point are preferably used. This avoids excessive delays caused by long signal paths.

In this case, a configuration of the FPGA can be represented as a plurality of levels. The lowest level comprises a bit stream which describes the configuration and can be directly written to the configuration memory of the FPGA. The next higher level comprises the logic description in the form of a mapped netlist in which a desired functionality has already been mapped to the logic and connection elements and can therefore be translated into a bit stream. The next higher level comprises a logic description in the form of an unmapped netlist in which mapping to specific elements of the respective FPGA module has not yet been carried out. Depending on the procedure when creating the configuration, there may be even higher abstraction levels, such as a description of the configuration in a hardware description language such as VHDL or SystemC which is then converted into a netlist. The description in the form of a block diagram of a technical computing environment such as Matlab and Simulink is also possible since the block diagram can be translated into a representation of the FPGA configuration in a hardware description language using the Xilinx system generator, for example. In this case, provision may also be made for the block diagram to be used in an automated manner to create a list of possible transfer points which contains, for example, the logic elements corresponding to the inputs and outputs of a block or of a subsystem.

The changed bit stream can be written completely or in a differential manner, in which case a changed bit stream is therefore preferably written only for changed logic elements or regions. Writing the changed bit stream to the programmable logic module is used to mean, in particular, an operation of writing to the configuration memory of the programmable logic module, in which case only those frames or address areas of the configuration memory which comprise one or more reconfigured or additional logic elements or connection elements are expediently written to during differential writing. In this case, provision may also be made to write to a nonvolatile memory which is read during initialization of the programmable logic module and determines the contents of the configuration memory; the changed bit stream can therefore be written to the programmable logic module indirectly.

An important advantage of the method according to the disclosed system is that minor changes to logic functions can be carried out very quickly since only the newly added parts of a logic function have to be placed and routed. This enables a functionality which is comparable to the internal bypassing, even for control devices which comprise an FPGA. A multiplicity of incremental changes can therefore be carried out and tested in a short time, which allows the established workflow for the regulator design to be retained.

By virtue of the fact that the producer of the initial configuration also provides relevant structure or assignment information in addition to the original bit stream, changes to logic functions can be made without the entire logic description of the configuration having to be disclosed. On the one hand, the producer can therefore keep the detailed source code secret and, on the other hand, can provide interfaces which make it possible for the user to quickly adapt proven logic functions.

It is also advantageous that no previously implemented partition interfaces or "virtual sockets" are necessary; the existing logic and connection elements of the FPGA module can also be efficiently used as a result of the fact that there is no division into a plurality of partitions with corresponding empty areas.

Another advantage is that a desired functionality is immediately available without delay after restarting the control device as a result of the adaptation of the programming bit stream which is preferably stored in a nonvolatile memory. The nonvolatile memory used to initialize the programmable logic module can be read via a microcontroller or an accordingly configured additional logic module such as a CPLD, which are expediently arranged on a printed circuit board with the programmable logic module or are integrated in the control device; in principle, the programmable logic module may also comprise a nonvolatile memory.

If a sufficiently large number of free logic elements are available in the initial configuration, provision may be made for only the connection between logic elements which are no longer used and the transfer points to be removed and for the changed logic functions to be implemented only using logic elements which are already unused at the outset. It is therefore possible to change the configuration of the programmable logic module even in the case in which the assignment information comprises only the transfer points and a list of the originally free logic elements.

According to one preferred embodiment of the invention, the logic elements of the initial configuration which are not used in the target configuration and the outputs of which are connected only to one or more inputs of at least one of the transfer points are also marked as free. If an output of a logic element in the initial configuration is or was therefore connected to an input of a transfer point, but the input of the transfer point in the target configuration is connected to another logic element, the logic element is not used in the target configuration and can be marked as free. The corresponding connection elements are preferably also marked as unused. In this case, the corresponding connection elements comprise, in particular, switchable connection elements, which connect the output of the logic element marked as free to one or more conductor tracks in the initial configuration and connect this (these) conductor track(s) to one or more inputs of one or more transfer points, and expediently this (these) conductor track(s) which is/are not connected in the target configuration. Such release or purging of logic elements which are no longer used maximizes the free area and the number of logic elements available for the reconfiguration. Releasing logic and connection elements is particularly advantageous when the initial configuration virtually completely uses the resources of the FPGA module.

In one particularly preferred embodiment of the invention, all logic elements whose outputs are exclusively connected to the inputs of logic elements marked as free in a previous step are likewise recursively marked as free. If the output of a logic element is connected only to the input of a logic element marked as free in a previous step, that is to say the output value would be rejected, the logic element is no longer used and can likewise be marked as free. Therefore, all logic elements which are no longer required and expediently connection elements which are also no longer required are gradually released.

According to another particularly preferred embodiment of the invention, all logic elements in a predefined region around one or more replaced logic elements of the initial configuration or an input of a transfer point are marked as free and the corresponding connection elements are marked as unused, all logic elements in the predefined region, with the exception of the replaced logic element(s), then being newly placed and connected using unused connection elements. With a suitable choice of the region (for example on the basis of a defined radius around the respective transfer point), the placement or routing can therefore also be optimized, as a result of which a largely optimal time behavior is ensured with only a slight increase in the required design time.

In a further particularly preferred embodiment of the invention, the connection elements which are used in the initial configuration and end at one of the logic elements in the predefined region, at least up to the next connected logic element outside the predefined region, are marked as unused. This ensures that sufficient connection elements for optimized routing are available in the predefined region.

The step of reading in an initial configuration expediently comprises reading in a bit stream and a conversion of the bit stream into a logic description, which conversion is carried out at least for parts of the bit stream. The conversion can be carried out, in particular, using architecture information relating to the programmable logic module used, in which case a relationship between the position in the bit stream and the logic element on the programmable logic module is therefore established using architecture information relating to the programmable logic module used.

It is advantageous if the changed bit stream is created using the target configuration by establishing a relationship between the position in the bit stream and the logic element on the programmable logic module for the logic elements which have been changed and therefore need to be reconfigured and by changing the original bit stream at the corresponding positions. In this case, provision may be made to create a differential bit stream which describes only the changed logic and connection elements or comprises only address areas in which there is at least one changed logic element. If suitable architecture or assignment information is available, only a minimum amount of data therefore needs to be written.

Alternatively, it is advantageous if the changed bit stream is created using the target configuration by translating the mapped netlist of the target configuration into a new complete bit stream. If a mapped netlist of the entire target configuration is available, it is possible to quickly create the changed bit stream.

For a logic function which is to be changed and comprises at least one signal path, a signal propagation time is preferably determined at least after the change. A signal propagation time is preferably estimated for a signal path in the target configuration of the programmable logic module, over the course of which at least one additional or reconfigured logic element or connection element occurs, by counting the number of sequentially successive logic elements in the signal path in the target configuration and assigning a constant signal propagation time to each logic element. Alternatively, provision may also be made for a signal path in the target configuration of the programmable logic module, over the course of which at least one additional or reconfigured logic element occurs, to be compared with the corresponding signal path in the initial configuration, in particular by counting and comparing the number of sequentially successive logic elements in the signal path in the target configuration and the number of sequentially successive logic elements in the corresponding signal path in the initial configuration and assigning a constant signal propagation time to each logic element. This makes it possible to quickly and easily determine whether the target configuration can presumably be operated at the same clock rate as the initial configuration or whether problems can be expected in the time behavior of the circuit.

Instead of an estimation of the signal propagation times of logic elements which is based on the number of logic elements in the signal path, the minimum and maximum signal propagation times given by architecture information are particularly preferably determined and used for the further considerations. The minimum and maximum signal propagation times of the individual logic elements over a signal path can be expediently summed in each case and can be checked for compliance with time requirements, in particular of the downstream logic elements.

For all logic functions to be changed, at least one signal propagation time is particularly preferably determined and is compared with one or more threshold values describing time requirements of the transfer points following the changed logic function, in particular. A warning and/or a modification of the mapped netlist of the target configuration is/are carried out if the change in the estimated or calculated delay exceeds the threshold value. For example, the modification may comprise a local increase in the clock and/or insertion of registers. The user can therefore be made aware of a potentially critical time behavior in advance, and measures can also be expediently taken in order to ensure a defined time behavior of the target configuration.

The target configuration preferably comprises at least one first multiplexer which is arranged, in particular, directly upstream of a transfer point, wherein all added logic elements are arranged in new signal paths which comprise a single input of the first multiplexer. By virtue of the fact that the bypass function is connected to a first input of the multiplexer and the previous logic function is connected to a second input of the multiplexer, it is therefore also possible to change over between the bypass function and the original function at the runtime, that is to say during the target configuration. In this case, a free input of an existing multiplexer can be used or the multiplexer can be inserted.

In particular, the new signal paths comprise at least one interface pin of the programmable logic module, the at least one interface pin preferably being assigned to a debugging interface of the programmable logic module. In this case, the interface pin need not be exclusively used for the new signal path, but rather may also provide further functionalities. A protocol is preferably defined, with the result that the data required for the signal path are tunneled via the interface pin. In this respect, this interface pin need not be a physically present pin, but rather may also be an interface or a data channel which is expediently constructed using the debug interface. Provided that at least one interface pin of the FPGA module is still unassigned or its functionality can be supplemented, external bypassing can therefore be carried out or else a multiplexer can be externally actuated to change over between different internal logic functions. The interface pins assigned to a debugging interface are rarely assigned to other functions and are therefore frequently available. If one or more other interface pins are still unassigned, a higher data rate can also be ensured, in principle, during external bypassing by using these interface pins for transmission according to a suitable protocol, for example LVDS.

It is advantageous if the target configuration comprises at least one second multiplexer which is arranged, in particular, directly downstream of a transfer point, the second multiplexer being connected to at least one input of a logic element. This makes it possible to change the input signals of a function, in which case the original function can possibly continue to be used with the changed input signal.

The target configuration preferably comprises at least one added register, the output of the register preferably being connected to an interface pin which is assigned, in particular, to a debugging interface of the programmable logic module. By virtue of the fact that the register is arranged in a signal path, the corresponding signal can also be recorded and evaluated by an RCP system which is connected to the debugging interface.

Also disclosed is a method for adapting a control device comprising a programmable logic module set up to execute a regulating function, in which the programmable logic module is reconfigured by means of a method according to the present disclosure. Using a method according to the present disclosure therefore also makes it possible to quickly and easily adapt control devices comprising an FPGA, with the result that it is possible to iteratively develop the new regulating function. In this case, the term regulating function is used to expediently mean all functions provided by the control device or the programmable logic module, in particular also actuation of an actuator without a closed control loop.

At least the step of writing a changed bit stream to the programmable logic module is expediently carried out during initialization of the programmable logic module and is carried out by a microprocessor, in particular. The adapted logic function or the bypass function is therefore directly available at the starting time of the FPGA or of the control device comprising the FPGA.

In another exemplary embodiment, a programming apparatus for writing to a programmable logic module, comprising a processor, a programming interface and/or a debugging interface, the apparatus being set up to carry out a method according to the invention.

In another exemplary embodiment, a computer program product having a computer-readable storage medium in which instructions are embedded, which instructions, when executed by a computing unit, cause the computing unit to be set up to carry out a method according to the invention.

BRIEF DESCRIPTION OF THE DRAWINGS

The embodiments are explained in more detail below with reference to the drawings. In this case, identical parts are labeled with identical designations. The embodiments illustrated are highly schematic, that is to say the distances and the lateral and vertical dimensions are not true to scale and also do not have any derivable geometric relationships with respect to one another, unless indicated otherwise. In the drawings.

DETAILED DESCRIPTION OF THE INVENTION

An FPGA module comprises a multiplicity of logic elements and connection elements as well as a clock supply which can comprise a plurality of clock regions. The logic elements comprise, for example, registers, truth tables (also known as look-up tables or LUTs), adders, switches and delay units. Frequency generators may also be present. Depending on the granularity of the FPGA module, a plurality of these elements may also be combined to form an elementary unit. The connection elements expediently comprise conductor tracks of different length, which can also span regions of the FPGA for example, and switchable connections between the conductor tracks and logic elements. After the voltage supply has been switched on, the FPGA is initialized with a bit stream which expediently contains at least one bit for each logic element; this enables a logic circuit tailored to the respective application on a standard module. In this case, a bit for configuring a logic element may also be understood as meaning a switch which connects the logic element to a signal. In this sense, one or more configuration bits may also be assigned to an AND gate.

Figure 1:
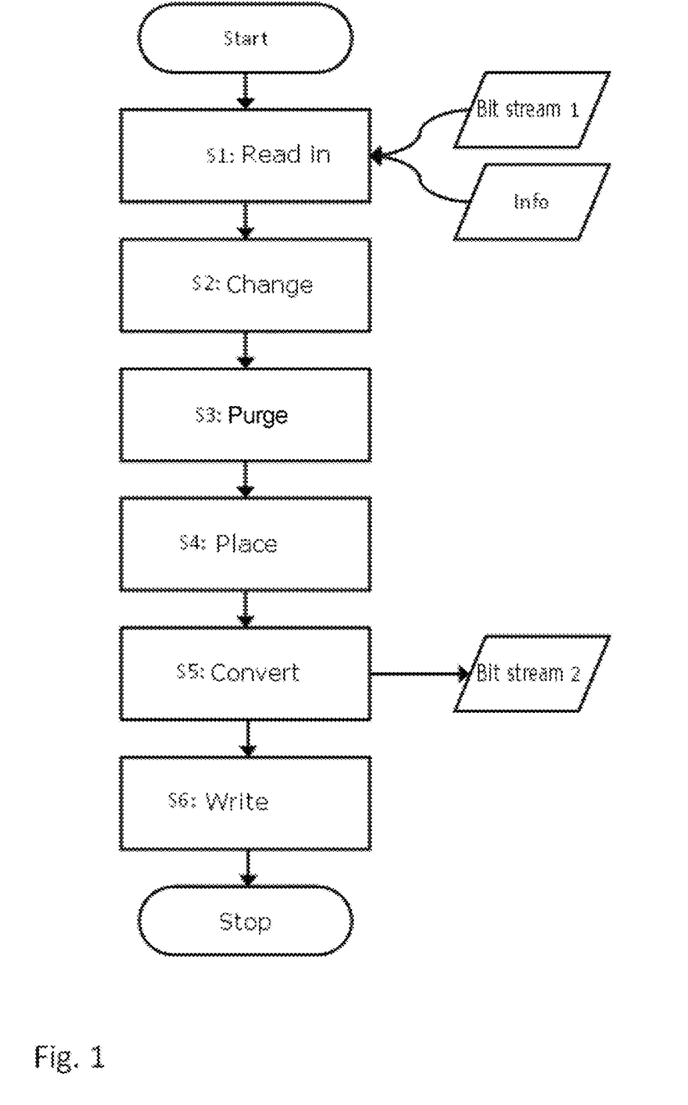
FIG. 1 shows a schematic flowchart of a first preferred embodiment of a method according to the invention.

The image in FIG. 1 shows a schematic flowchart of a first preferred embodiment of a method according to the invention.

In step S1 (read in), the initial configuration is read in, the original bit stream (bit stream 1) and information (info) relating to the architecture of the FPGA module used and the initial configuration being received as input data. The reading-in process may comprise converting the bit stream into a logic description or mapped netlist of the original configuration. Alternatively, provision may also be made for a logic description of at least parts of the initial configuration and information relating to possible input signals and possible transfer points of the initial configuration to also be received, in addition to the bit stream, as input data. It is then possible to dispense with converting the bit stream.

The changes desired in the target configuration are preferably made in step S2 (change) on a higher abstraction level than the logic description or an unmapped netlist. In principle, a hardware description language such as VHDL could also be used to indicate the target configuration or the desired changes.

For example, the user can choose new input signals and can apply an adapted logic function to the respective transfer point. This change to the configuration can also be interactively carried out in a program which is executed on a standard PC connected to the FPGA module or to the control device and/or on a special programming device; a standard PC having an externally connected debugging interface which can be connected to an FPGA is also intended to be able to be understood under the designation programming apparatus.

Such a program (called FPGA manager below) could read in, for example, the assignment information from the configuration producer, expediently architecture information relating to the FPGA module used and at least one logic description, in particular a mapped netlist, and/or a bit stream of the initial configuration. It is advantageous if the FPGA manager is set up to at least partially represent the initial configuration on a higher abstraction level than a logic description of an unmapped netlist or a block diagram. The user can then select and adapt one or more elementary units of the respective abstraction level. The deletion or insertion of elementary units is also expediently provided. The elementary units may comprise one or more logic units of the FPGA module. For example, a frequently used functionality from a plurality of logic units of the FPGA may also be predefined as an elementary unit. The user can preferably also select predefined transfer points and/or interface pins of the FPGA in order to supply them with the signals of the changed logic functions. It is also possible to provide for predefined conditions to be checked, in which case a separate signal, in particular, can be output via a debugging interface if the predefined conditions have not been met. An incorrectly defined logic function or invalid input data can therefore be quickly detected.

In step S3 (purge), logic elements which are no longer used are expediently removed from the initial configuration in order to make a larger number of free logic elements available for implementing the changed logic functions.

The FPGA manager can also provide here for the logic elements which are no longer used to be determined on the basis of the deleted elementary units.

In step S4 (place), the logic functions or logic elements added in the target configuration are placed on the free logic elements. The connection elements are then configured in order to obtain the desired signal paths. The target configuration is therefore in the form of a mapped netlist.

When placing and connecting the logic functions or logic elements, requirements with regard to the timing, for example the compliance with required signal propagation times, are expediently taken into account in this case in order to achieve predefined clock frequencies.

In this case, the FPGA manager can also provide for added logic elements to be determined using the added elementary units.

In step S5 (convert), the mapped netlist is converted into a changed bit stream which is therefore available as output data (bit stream 2).

Particularly if the logic description of the initial configuration is only partially available, the conversion may also involve generating suitable micro bit streams for added logic units and/or connection units and adding them to the original bit stream in order to obtain the changed bit stream.

In step S6 (write), the changed bit stream is written to the FPGA module and the latter is therefore reconfigured. Since time-consuming placement and routing were carried out only for the few changed logic elements, this reconfiguration can be carried out quickly and is also possible, in principle, without knowledge of the complete netlist.

Figure 2A:
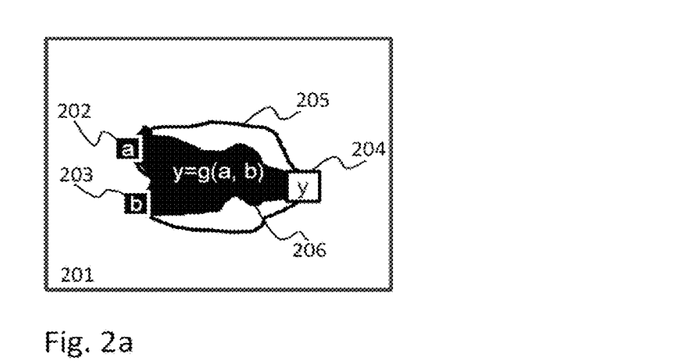
FIG. 2a shows a schematic illustration of a changed configuration of a programmable logic module.

The image in FIG. 2a schematically illustrates a changed configuration of a programmable logic module.

The configuration 201 comprises two transfer points 202 and 203, which provide input signals a and b, and a transfer point 204, to which the function result y is applied. The transfer points are preferably stipulated by the user using the FPGA manager or can be selected manually or automatically using a list of possible transfer points which is provided by the producer of the original configuration.

It is schematically illustrated that the region 205 occupied by the original logic function f has been released and that the added logic function y=g(a,b) is implemented in a region 206 using free or unused logic and connection elements, with the result that the outer region of the configuration 201 remains unaffected by the change.

Figure 2B:
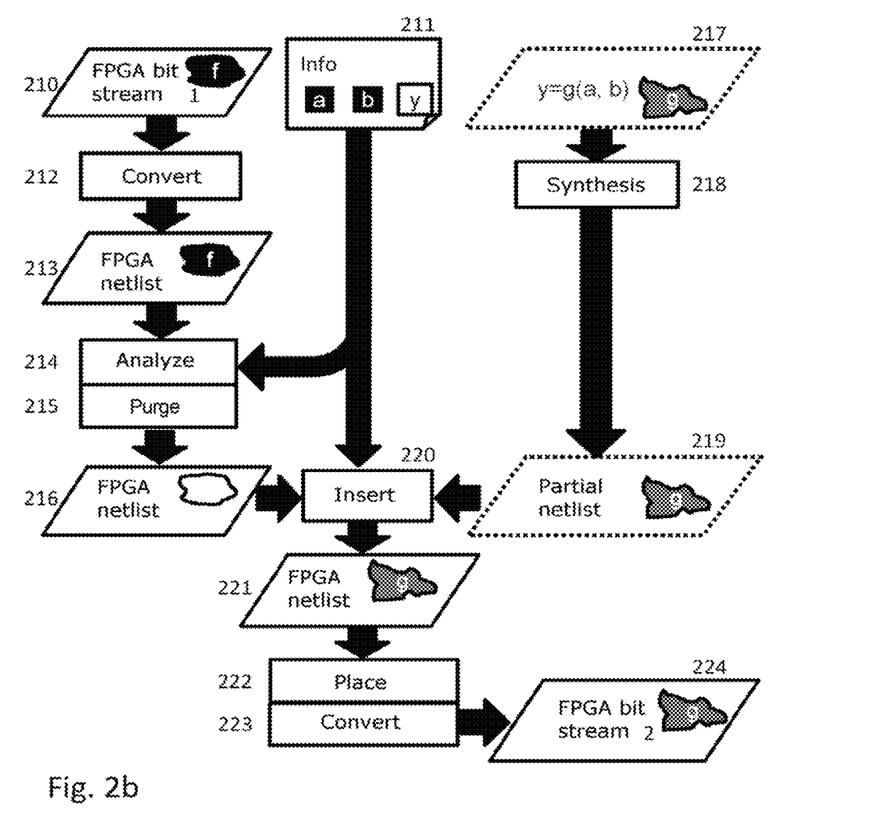
FIG. 2b shows a schematic illustration of a second preferred embodiment of a method according to the invention.

The image in FIG. 2b shows a schematic illustration of a second preferred embodiment of a method according to the invention.

At the beginning of the method, the original configuration 210 of the FPGA and assignment information 211 are read in. The initial configuration in FPGA bit stream 1 comprises a logic function y=f(a,b) which is intended to be replaced. As information for this, the two transfer points to which the input signals a and b are applied as well as the transfer point to which the function value y is intended to be applied are stated. Depending on the FPGA module used, the bit stream 210 may have, on the one hand, a fixed assignment between the position and the logic element or, on the other hand, may comprise a list of address/configuration pairs. Therefore, starting from a starting address, an entire address area (or the entire FPGA) can be newly written to, in principle, or the logic elements can be individually reconfigured.

In step 212, the bit stream 210 is converted into a mapped netlist 213. The mapped netlist 213 is analyzed using the stated transfer points and expediently architecture information relating to the FPGA in step 214, whereupon, in step 215, a purging process takes place in which logic and connection elements which are not used are marked as free or unused. The purged FPGA netlist 216 therefore has free logic elements or regions which can be used to implement the new function.

The new logic function 217 which can be described, in particular, using a block diagram is preferably based on the same input signals a, b as the original function and outputs a changed value y=g(a,b). In step 218, the changed logic function is therefore synthesized, that is to say the logic description of the subfunction is converted into an unmapped partial netlist 219.

On the basis of the information 211 relating to the transfer points, the partial netlist 219 is inserted into the purged FPGA netlist 216 in step 220, thus producing a netlist 221 describing the complete configuration.

The new logic function 217 which is still unplaced is placed on the free logic elements in step 222 and is routed using unused connection elements. In step 223, the complete netlist is converted into a new bit stream 224. A complete FPGA bit stream 2 which describes the target configuration and can be written to a programmable logic module directly or indirectly is therefore available.

Figure 3:
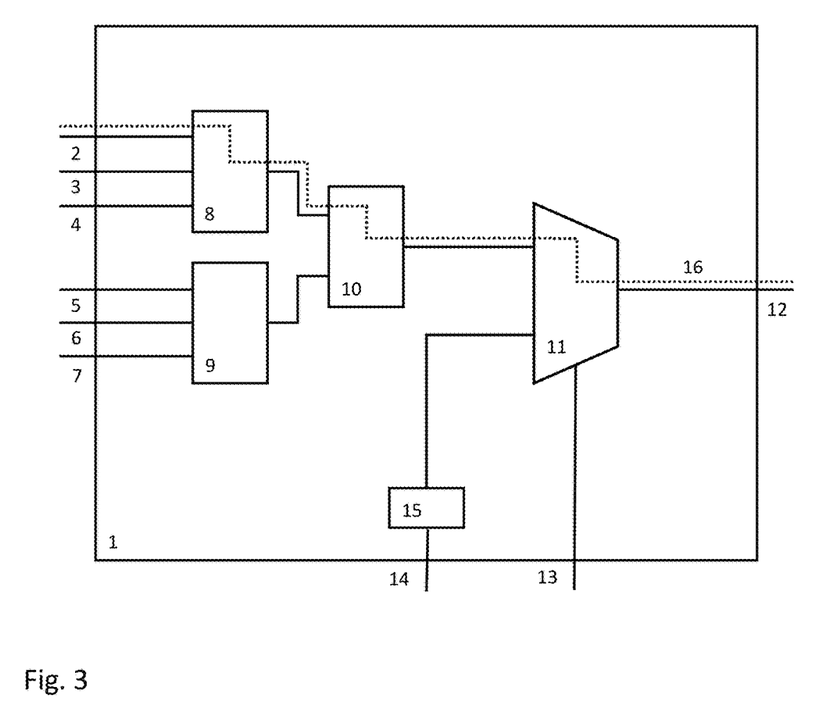
FIG. 3 shows a schematic view of a programmable logic module which can be reconfigured using a method according to an embodiment of the invention.

The image in FIG. 3 schematically illustrates a programmable logic module 1. Input signals are supplied to the FPGA 1 via interface pins 2, 3, 4, 5, 6, 7. The exemplary configuration illustrated has a plurality of function blocks which are illustrated in a simplified manner and are constructed, in principle, from a number of elementary logic units such as truth tables and flip-flops. The input signals applied to the interface pins 2, 3, 4 are supplied, for example, to function block 8 which calculates a first logic function. Accordingly, the input signals applied to the interface pins 5, 6, 7 are supplied to function block 9 which calculates a second logic function. The signals from the function blocks 8 and 9 are supplied to a further function block 10 which calculates a third logic function. The function result of the third logic function can be supplied to an interface pin 12 of the programmable logic module 1 via multiplexer 11 and is therefore output as the output signal. An exemplary signal path 16 is illustrated as a dashed line. The logic function which is shown and the output signal from which is output to interface pin 12 therefore comprises 6 signal paths each starting at one of the interface pins 2, 3, 4, 5, 6, 7.

By virtue of the fact that one of the function blocks 8, 9 or 10 is changed or replaced, the logic function output can be modified. As an alternative to completely replacing the original logic function, a changeover can also be enabled by retaining the original logic function and integrating a changed logic function in the configuration and by arranging a multiplexer at the output of the corresponding function block. In addition, preprocessing of the input signals of a logic function can also be inserted. In particular, it is possible to integrate an additional logic function which outputs a truth value for the validity of the input signals on the basis of one or more conditions. It is also possible to insert additional registers for retaining consistent data. If the FPGA 1 is used in a control device, internal bypassing can therefore be carried out.

By virtue of the fact that a further input of the multiplexer 11 arranged adjacent to output pin 12 is connected to a further interface pin 14, an external signal can also be output to interface pin 12. In order to avoid synchronization problems, it is expedient if the signal from interface pin 14 is supplied to a register 15, with the result that a defined signal is always applied to multiplexer 11. The desired input of multiplexer 11 can be selected via interface pin 13 and the output signal arranged in signal path 16 can therefore be changed. It is advantageous if the interface pins 14 and 13 are assigned to a debugging interface such as JTAG since these pins are generally not assigned and/or signals can be transmitted into or out of the FPGA via this debugging interface, expediently by expanding the existing debugging function protocols. If the FPGA 1 is used in a control device, external bypassing is therefore also possible.

Figure 4:
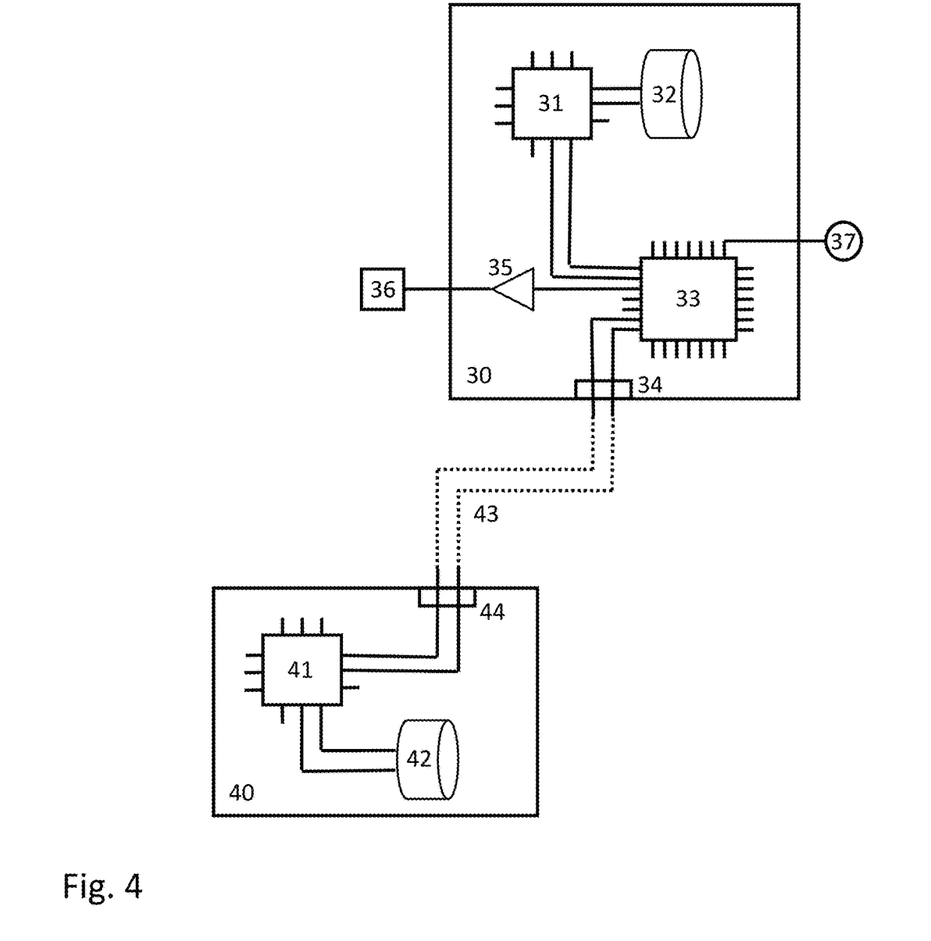
FIG. 4 shows a schematic view of a control device having a programmable logic module and a programming apparatus according to an embodiment of the invention.

The image in FIG. 4 shows a schematic view of a control device 30 having a programmable logic module 33 and a programming apparatus 40 according to an embodiment of the invention.

Control device 30 comprises a microcontroller 31 which is connected to a nonvolatile memory 32, in particular a flash memory, and to the FPGA 33. Microcontroller 31 may also be connected to one or more interfaces (not shown), in particular for a vehicle data bus, and/or further peripherals.

The programmable logic module 33 preferably provides a regulating function and, in the example shown, is connected to a sensor 37 and to an actuation circuit 35 which actuates an actuator 36. FPGA also has a programming and/or debugging interface 34.

Programming interface 34 is normally not connected and the control device provides one or more regulating functions; for example, actuator 36 may be a brushless electric motor, the speed and/or delivered torque of which is/are regulated by the programmable logic module 33.

Programming apparatus 40 comprises a microcontroller 41 which is connected to a nonvolatile memory 42, in particular a flash memory, and to a programming and/or debugging interface 44.

Connecting lines 43 which are illustrated using dashed lines can be used to connect the programming apparatus 40 to the control device 30 or to the FPGA 33 arranged on the latter. By virtue of the fact that the programmable logic module 33 is reconfigured, the regulating function can therefore be adapted with little effort.

In principle, the configuration can also be changed by connecting the programming device to the microcontroller 31 or to the nonvolatile memory 32 and writing the changed configuration to the nonvolatile memory 32 first of all and only indirectly to the programmable logic module 33. This has the advantage that the changed configuration is also immediately available during each further initialization of the control device 30.

The use of the debugging interface 34 shown in the image has the advantage that it makes it possible to change over between different logic or regulating functions during ongoing operation of the control device. For this purpose, a multiplexer may be arranged in the changed configuration directly upstream of that interface pin of the FPGA 33 which is connected to actuation circuit 35, for example, a first input of the multiplexer preferably being connected to the original regulating function and a second input of the multiplexer being connected to a changed regulating function.

The input to be switched through is particularly preferably selected via a register connected to the changeover input, with the result that the contents of the register determine the active regulating function. By virtue of the fact that a data channel is set up via the debugging interface 34, the contents of the register can be written by the programming device 40. The user can therefore change over between different regulating functions via programming device 40. This speeds up the design of new control devices or regulating functions further.

In another preferred embodiment of the invention, a register is arranged in a signal path of the initial configuration, the output of the register expediently being connected to a pin of the FPGA assigned to the debugging interface. The register therefore records a signal of the initial configuration and can transmit the signal to an external RCP system. By virtue of the fact that trigger logic is added, the recording time can be determined by evaluating predefined conditions. Alternatively or additionally, provision may also be made for the signal to be buffered on the programmable logic module. The method according to the present disclosure therefore makes it possible to add a measuring functionality even without the presence of the source code or a complete logic description of the initial configuration.

What is claimed is:

1. A method for changing a configuration of a programmable logic module, the method comprising:
    reading in an initial configuration of the programmable logic module,
    so that a logic description is available for at least a portion of the initial configuration,
    creating a logic description of a target configuration, the creating comprising:
        changing one or more logic elements and/or connection elements from the logic description of the initial configuration,
        adding one or more logic elements to the target configuration, and
        determining transfer points using assignment information,
        wherein the transfer points comprise logic elements present in the target configuration and the initial configuration, said logic elements including registers or drivers,
    marking as free unused logic elements of the initial configuration,
    placing the added one or more logic elements of the target configuration on any logic elements marked as free,
    connecting the added one or more logic elements of the target configuration to the transfer points via unused connection elements,
    creating a changed bit stream from the logic description of the target configuration, and
    writing the changed bit stream to the programmable logic module.

2. The method of claim 1, wherein the step of changing one or more logic elements comprises deleting said one or more logic elements, so that said one or more logic elements of the initial configuration are not used in the target configuration.

3. The method of claim 2, wherein the deleted one or more logic elements of the initial configuration that have outputs connected only to inputs of transfer points are marked as free, and wherein the connection elements corresponding to the marked free logic elements are marked as unused.

4. The method of claim 3, wherein all logic elements in a predefined region around one or more deleted logic elements of the initial configuration or all logic elements in a predefined region around an input of a transfer point are marked as free, and wherein the connection elements corresponding to the logic elements in the predefined region are marked as unused, and wherein the logic elements in the predefined region that have not been deleted are placed and connected using unused connection elements.

5. The method of claim 4, wherein the connection elements which are used in the initial configuration and end at one of the logic elements in the predefined region, at least up to a next connected logic element outside the predefined region, are marked as unused.

6. The method of claim 3, wherein all logic elements of the initial configuration whose outputs are connected only to one or more inputs of logic elements of the initial configuration marked as free in a previous step are likewise recursively marked as free, and wherein corresponding connection elements are marked as unused.

7. The method of claim 6, wherein all logic elements in a predefined region around one or more deleted logic elements of the initial configuration or the predefined region around an input of a transfer point are marked as free, and wherein the connection elements corresponding to the logic elements in the predefined region are marked as unused, and wherein the logic elements in the predefined region that have not been deleted are placed and connected using unused connection elements.

8. The method of claim 7, wherein the connection elements which are used in the initial configuration and end at one of the logic elements in the predefined region, at least up to the next connected logic element outside the predefined region, are marked as unused.

9. The method of claim 1, wherein the step of changing one or more logic elements comprises reconfiguring said one or more logic elements.

10. The method of claim 1, wherein the step of reading in an initial configuration comprises reading in a bit stream and converting at least one portion of the bit stream into a logic description, wherein said converting uses architecture information relating to the programmable logic module.

11. The method of claim 10, wherein the logic description of at least one portion of the initial configuration comprises a mapped netlist.

12. The method of claim 1, wherein the changed bit stream is created using the target configuration by establishing a relationship between a position in a bit stream and either a logic element or a connection element which are on the programmable logic module, wherein the logic element or the connection element has been changed, and by changing an original bit stream at corresponding positions.

13. The method of claim 1, wherein the changed bit stream is created using the target configuration by translating a mapped netlist of the target configuration into a new complete bit stream.

14. The method of claim 1, wherein a changed logic function is applied to a transfer point in the target configuration, the changed logic function comprises at least one signal path, the method also comprising:
determining a signal propagation time at least after the changed logic function is performed,
estimating the signal propagation time for the signal path in the target configuration, wherein at least one additional or reconfigured logic element or connection element occurs over a course of the signal path,
counting a number of sequentially successive logic elements in the signal path in the target configuration, and
assigning a constant signal propagation time to each logic element.

15. The method of claim 1, wherein the changed logic function is applied to the transfer points in the target configuration, the method also comprising:
determining at least one signal propagation time,
comparing the signal propagation time with at least one threshold value, and
carrying out either a warning or a modification of a mapped netlist of the target configuration if the signal propagation time either exceeds at least one threshold value or is outside a predefined range.

16. The method of claim 1, wherein the target configuration comprises at least one first multiplexer which is arranged directly upstream of a transfer point, and wherein all logic elements added to the target configuration are arranged in new signal paths which comprise a single input of the first multiplexer.

17. The method of claim 16, wherein the new signal paths comprise at least one interface pin of the programmable logic module, the at least one interface pin being assigned to a debugging interface of the programmable logic module.

18. The method of claim 16, wherein the target configuration comprises at least one second multiplexer which is arranged directly downstream of a transfer point, the second multiplexer being connected to at least one input of a logic element.

19. The method of claim 1, wherein the target configuration comprises at least one added register, an output of the added register being connected to an interface pin which is assigned to a debugging interface of the programmable logic module.

20. The method of claim 1, further comprising adapting a control device comprising a programmable logic module set up to execute a regulating function.

21. A programming apparatus for writing to a programmable logic module, comprising a processor and an interface for communicating programming instructions, the instructions comprising:
instructions for reading in an initial configuration of the programmable logic module,
so that at a logic description is available for at least a portion of the initial configuration,
instructions for creating a logic description of a target configuration, the creating comprising:
instructions for changing one or more logic elements and/or connection elements from the logic description of the initial configuration,
instructions for adding one or more logic elements to the target configuration, and
instructions for determining transfer points using assignment information,
wherein the transfer points comprise logic elements present in the target configuration and the initial configuration, said logic elements including registers or drivers,
instructions for marking as free unused logic elements of the initial configuration,
instructions for placing the added one or more logic elements of the target configuration on any logic elements marked as free,
instructions for connecting the added one or more logic elements of the target configuration to the transfer points via unused connection elements,
instructions for creating a changed bit stream from the logic description of the target configuration, and
instructions for writing the changed bit stream to the programmable logic module.

22. A computer program product having a non-transitory computer-readable storage medium in which instructions are embedded, the instructions comprising:
instructions for reading in an initial configuration of a programmable logic module,
so that at a logic description is available for at least a portion of the initial configuration,
instructions for creating a logic description of a target configuration, the creating comprising:
instructions for changing one or more logic elements and/or connection elements from the logic description of the initial configuration,
instructions for adding one or more logic elements to the target configuration, and
instructions for determining transfer points using assignment information,
wherein the transfer points comprise logic elements present in the target configuration and the initial configuration, said logic elements including registers or drivers,
instructions for marking as free unused logic elements of the initial configuration,
instructions for placing the added one or more logic elements of the target configuration on any logic elements marked as free,
instructions for connecting the added one or more logic elements of the target configuration to the transfer points via unused connection elements,
instructions for creating a changed bit stream from the logic description of the target configuration, and
instructions for writing the changed bit stream to the programmable logic module.

* * * * *